(12) United States Patent
Sakamaki et al.

(10) Patent No.: US 11,640,957 B2
(45) Date of Patent: May 2, 2023

(54) LIGHT EMITTING MODULE

(71) Applicant: NICHIA CORPORATION, Anan (JP)

(72) Inventors: So Sakamaki, Tokushima (JP);
Yasunori Nagahama, Naruto (JP);
Masahiko Sano, Anan (JP);
Katsuyoshi Kadan, Tokushima (JP)

(73) Assignee: NICHIA CORPORATION, Anan (JP)

( * ) Notice: Subject to any disclaimer, the term of this patent is extended or adjusted under 35 U.S.C. 154(b) by 49 days.

(21) Appl. No.: 17/116,531

(22) Filed: Dec. 9, 2020

(65) Prior Publication Data

US 2021/0091053 A1 Mar. 25, 2021

Related U.S. Application Data

(63) Continuation of application No. 16/454,906, filed on Jun. 27, 2019, now Pat. No. 10,892,255.

(30) Foreign Application Priority Data

Jun. 29, 2018 (JP) .............................. JP2018-123939

(51) Int. Cl.
*H01L 25/075* (2006.01)
*H01L 33/50* (2010.01)
(Continued)

(52) U.S. Cl.
CPC ...... *H01L 25/0753* (2013.01); *H01L 33/0093* (2020.05); *H01L 33/507* (2013.01);
(Continued)

(58) Field of Classification Search
None
See application file for complete search history.

(56) References Cited

U.S. PATENT DOCUMENTS

2006/0124954 A1 6/2006 Akaishi
2013/0187182 A1 7/2013 Muramatsu et al.
(Continued)

FOREIGN PATENT DOCUMENTS

JP 2006-100444 A 4/2006
JP 2007294506 A 11/2007
(Continued)

OTHER PUBLICATIONS

Non-Final Office Action in the related U.S. Appl. No. 16/454,906 dated Apr. 24, 2020.
(Continued)

*Primary Examiner* — Michelle Mandala
(74) *Attorney, Agent, or Firm* — Global IP Counselors, LLP

(57) ABSTRACT

A light emitting module includes a substrate, a light reflective resin layer, wiring electrodes and a light emitting element. The light reflective resin layer is arranged on the substrate. The wiring electrodes are arranged over the substrate with the light reflective resin layer being interposed between the substrate and the wiring electrodes. The light emitting element has an electrode formation surface including a positive and negative pair of element electrodes, and a light emitting surface on a side opposite to the electrode formation surface. The light emitting element is arranged on top surfaces of the wiring electrodes with the element electrodes facing the top surfaces of the wiring electrodes.

13 Claims, 6 Drawing Sheets

(51) Int. Cl.
    *H01L 33/62*    (2010.01)
    *H01L 33/60*    (2010.01)
    *H01L 33/00*    (2010.01)

(52) U.S. Cl.
    CPC .............. *H01L 33/60* (2013.01); *H01L 33/62* (2013.01); *H01L 2933/0041* (2013.01); *H01L 2933/0058* (2013.01); *H01L 2933/0066* (2013.01)

(56)                References Cited

U.S. PATENT DOCUMENTS

| 2016/0093780 | A1  | 3/2016  | Beppu et al. |
| 2017/0317250 | A1  | 11/2017 | Konishi et al. |
| 2018/0175265 | A1* | 6/2018  | Kim ..................... H01L 33/483 |
| 2018/0294391 | A1  | 10/2018 | Emura |

FOREIGN PATENT DOCUMENTS

| JP | 2010040558  A | 2/2010 |
| JP | 2011-258673 A | 12/2011 |
| JP | 2013153068  A | 8/2013 |
| JP | 2013-247301 A | 12/2013 |
| WO | 2016067794 A1 | 5/2016 |

OTHER PUBLICATIONS

Notice of Allowance in the related U.S. Appl. No. 16/454,906 dated Sep. 23, 2020.

* cited by examiner ated example can be applied to other embodiments and worked examples.

LIGHT EMITTING MODULE

CROSS-REFERENCE TO RELATED APPLICATIONS

This application is a continuation application of U.S. patent application Ser. No. 16/454,906 filed on Jun. 27, 2019. This application claims priority to Japanese Patent Application No. 2018-123939 filed on Jun. 29, 2018. The entire disclosures of U.S. patent application Ser. No. 16/454, 906 and Japanese Patent Application No. 2018-123939 are hereby incorporated herein by reference.

TECHNICAL FIELD

The present invention relates to a method of manufacturing a light emitting module.

BACKGROUND ART

Light emitting devices that use light emitting elements such as light emitting diodes, etc., are widely used as a backlight of a liquid crystal display, various types of light sources of a display, etc. As this kind of light emitting device, there has been proposed a structure for which the light emitting element is mounted on a substrate having wiring. For example, Japanese Laid-Open Patent Publication No. 2006-100444 noted hereafter discloses a light emitting device that has wiring on the top surface of a substrate, and has an electrode of the bottom surface of the light emitting element connected to that wiring.

SUMMARY

In recent years, there has been demand for further miniaturization of light emitting devices. To miniaturize the light emitting device, it is necessary to do placement with high precision when forming wiring.

The present invention provides a method of manufacturing a light emitting module for which miniaturization is possible.

A light emitting module includes a substrate, a light reflective resin layer, wiring electrodes and a light emitting element. The light reflective resin layer is arranged on the substrate. The wiring electrodes are arranged over the substrate with the light reflective resin layer being interposed between the substrate and the wiring electrodes. The light emitting element has an electrode formation surface including a positive and negative pair of element electrodes, and a light emitting surface on a side opposite to the electrode formation surface. The light emitting element is arranged on top surfaces of the wiring electrodes with the element electrodes facing the top surfaces of the wiring electrodes.

According to the method of manufacturing a light emitting module of an embodiment of the present invention, it is possible to realize the light emitting module for which miniaturization is possible.

DETAILED DESCRIPTION OF EMBODIMENTS

Figure 1:
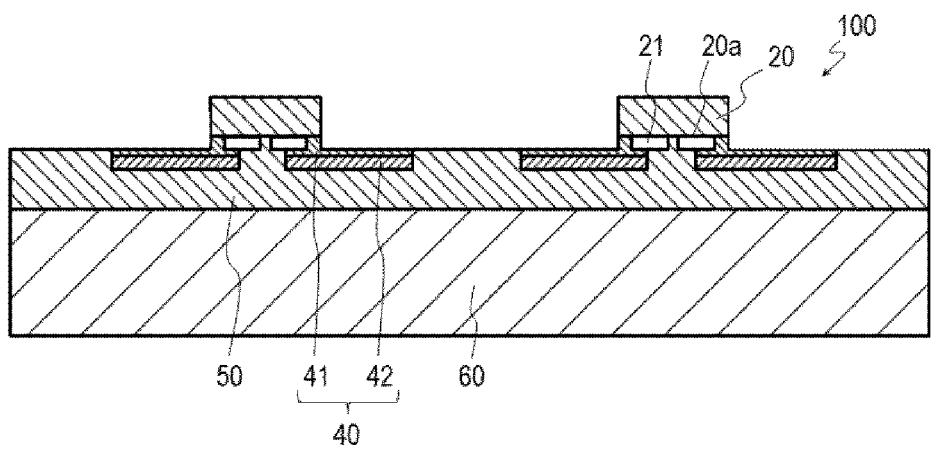
FIG. 1 is a schematic cross section diagram of a light emitting module of an embodiment of the present invention.

Following, an embodiment of the present invention is explained while referring to drawings as appropriate. However, the embodiment(s) explained hereafter is for putting the technical concept of the present invention into specific form, and unless specifically noted, the present invention is not limited to the items noted hereafter. Also, the size, positional relationship, etc., of the members shown in the drawings may be exaggerated to clarify the explanation.

Hereafter, a detailed explanation is given of the present invention based on the drawings. With the explanation hereafter, terms indicating specific directions or positions are used as necessary (for example, "upper," "lower," and other terms including these terms), but those terms are used to make it easier to understand the explanation with reference to the drawings, and the technical scope of the present invention is not limited by the meaning of those terms. Also, parts with the same code number appearing in multiple drawings indicate the same or equivalent parts or members.

Furthermore, the embodiment shown hereafter shows an example of the light emitting module to put into specific form the technical concept of the present invention, and the present invention is not limited to the item noted hereafter. Also, the dimensions, materials, shape, relative placement, etc., of constituent parts noted hereafter are intended to show an example, and unless specifically noted, do not mean that the scope of the present invention is limited only to those. Also, the contents explained with one embodiment or working example can also be applied to other embodiments or working examples. Also, the size, positional relationship, etc., of members shown in the drawings may be exaggerated to clarify the explanation.

FIG. 1 is a schematic cross section diagram of the light emitting module obtained using the manufacturing method of this embodiment.

The light emitting module comprises: a substrate 60; a light reflective resin layer 50 provided on the top surface of the substrate 60; a wiring electrode 40 provided above the substrate 60 with the light reflective resin layer 50 interposed; and a light emitting element 20 mounted on the top surface of the wiring electrode 40.

The light emitting element 20 has an electrode formation surface 20a comprising a positive and negative element electrode 21, and a light emitting surface on the side opposite the electrode formation surface 20a. The light emitting element 20 is flip-chip mounted directly or with a bump, etc., interposed so that the element electrode 21 faces opposite the top surface of the wiring electrode 40.

Hereafter, a detailed explanation is given regarding the method of manufacturing a light emitting module based on the schematic cross section diagrams shown in FIGS. 2 to 12.

(Step for Placing Light Emitting Element 20)

Figure 2:
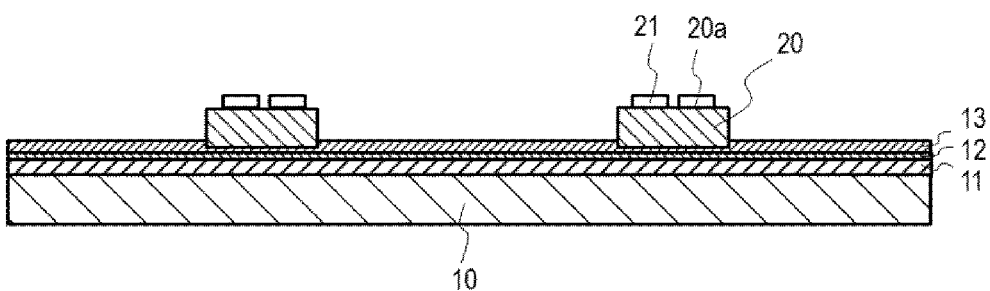
FIG. 2 is a schematic cross section diagram showing a manufacturing step of the light emitting module of an embodiment of the present invention.

As shown in FIG. 2, the light emitting element 20 is placed on a support member 10. The light emitting element 20 is placed in a state with the electrode formation surface 20a facing upward, and the light emitting surface facing downward. In the light emitting module, it is also possible to place a plurality of the light emitting elements 20 with a designated interval open. In this case, in a step for forming the wiring electrode 40 described later, it is possible to electrically connect the element electrodes 21 of the light emitting elements 20 to each other using the wiring electrodes 40.

The support member 10 is an item for which mounting of the light emitting element 20 is possible. The shape of the support member 10 is not particularly limited, but it is preferable that the top surface be flat. The support member 10 and the light emitting element 20 are stuck together using an adhesive layer 13. As the adhesive layer 13, it is possible to use VPA, etc., for example.

On the top surface of the support member 10, a photosensitive resin layer is formed as a peeling layer 11. The adhesive layer 13 is formed on the top surface of the peeling layer 11 with a protective layer 12 interposed. The peeling layer 11 is an item for separating the light emitting element 20 from the support member 10 later by irradiating light.

Figure 3:
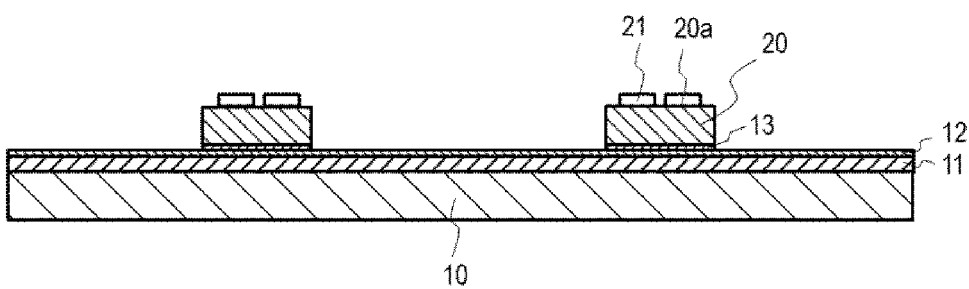
FIG. 3 is a schematic cross section diagram showing a manufacturing step of the light emitting module of an embodiment of the present invention.

Next, as shown in FIG. 3, the adhesive layer 13 of the region other than the mounting region of the light emitting element is removed by etching. The protective layer 12 has a role of preventing etching of the peeling layer 11. As the material of the protecting layer 12, it is preferable to use metal. As the metal of the protective layer 12, it is possible to use Ti, etc.

(Step for Forming Coating Layer 30)

Next, a coating layer 30 is formed on the support member, surrounding the light emitting element 20. The coating layer 30 is provided by applying a material of the coating layer 30 on the support member. The application method can be spin coating using a spin coater, discharge using a dispenser, etc., and is not particularly restricted. For the coating layer 30, it is preferable to use a member configured using an organic substance. By doing this, in the step for removing the coating layer 30 described later, it is possible to easily do removal using etching. As the organic substance, it is possible to use a polyimide, for example.

Figure 4:
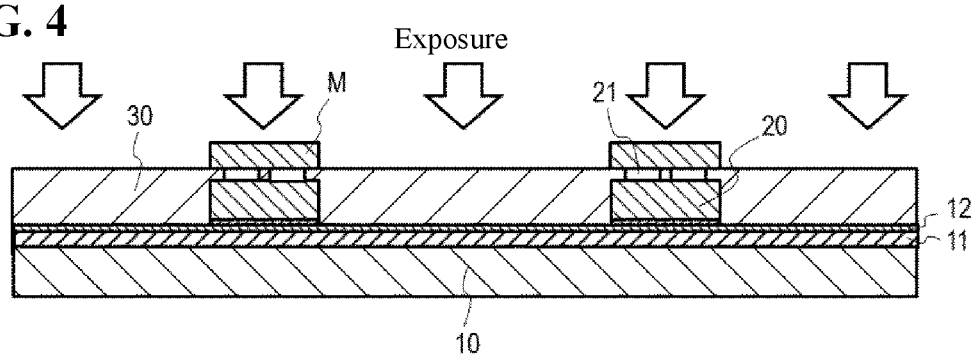
FIG. 4 is a schematic cross section diagram showing a manufacturing step of the light emitting module of an embodiment of the present invention.
Figure 5:
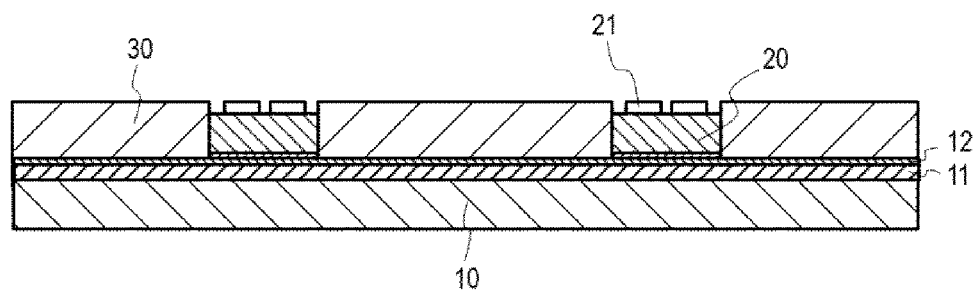
FIG. 5 is a schematic cross section diagram showing a manufacturing step of the light emitting module of an embodiment of the present invention.

For example, when using resist as the coating layer 30, as shown in FIG. 4, after providing the resist so as to cover the support member 10 and the light emitting element 20, as shown in FIG. 4, exposure is done via a mask M formed in a shape covering above the light emitting element 20, and by developing, an opening by which the electrode formation surface 20a of the light emitting element 20 is exposed is formed as shown in FIG. 5.

(Step for Forming Wiring Electrode 40)

Next, the wiring electrode 40 is formed extending from the element electrode 21 of the light emitting element 20 over the coating layer 30. The wiring electrode is formed by laminating a first metal layer 41 and a second metal layer 42.

Figure 6:
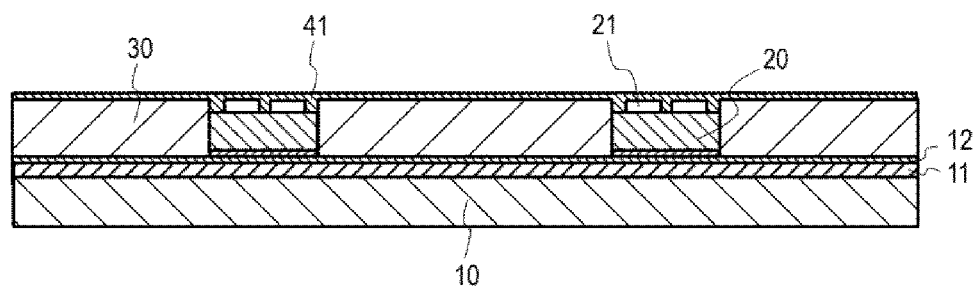
FIG. 6 is a schematic cross section diagram showing a manufacturing step of the light emitting module of an embodiment of the present invention.

In the step for forming the wiring electrode, first, as shown in FIG. 6, the first metal layer 41 is formed by sputtering, etc., on approximately the entire surface of the element electrode 21 of the light emitting element 20 and the coating layer 30. The first metal layer 41 is used as a seed layer when forming the second metal layer 42 using an electrolytic plating method in the step for forming the second metal layer 42 which is post-processing. As the laminated structure of the first metal layer 41, an example is Al/Ti/Cu, etc., from the support member 10 side.

Figure 7:
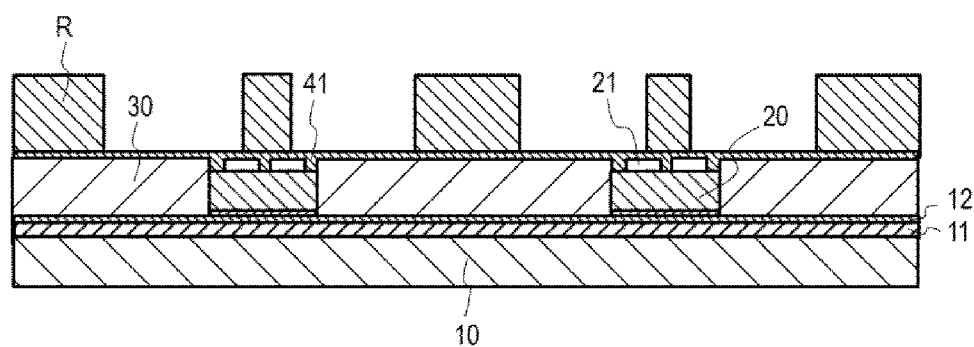
FIG. 7 is a schematic cross section diagram showing a manufacturing step of the light emitting module of an embodiment of the present invention.

Next, as shown in FIG. 7, a resist R is provided on the first metal layer 41. In the plan view, the resist R is formed to have an opening that includes at least a portion of the element electrode 21.

Figure 8:
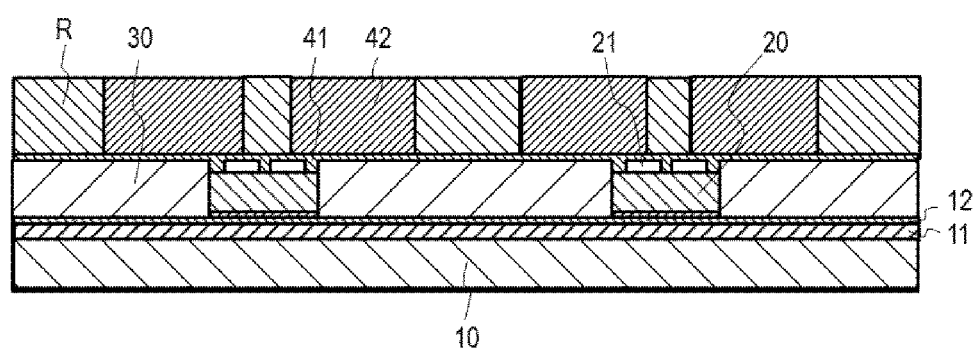
FIG. 8 is a schematic cross section diagram showing a manufacturing step of the light emitting module of an embodiment of the present invention.

Next, as shown in FIG. 8, inside the opening of the resist R, the second metal layer is formed using the electrolytic plating method. For the second metal layer, the first metal layer is used as the seed layer for electrolytic plating, in other words, as a current path, and is formed by growing plating within the opening of the resist. As the second metal layer, an example includes Cu.

Figure 9:
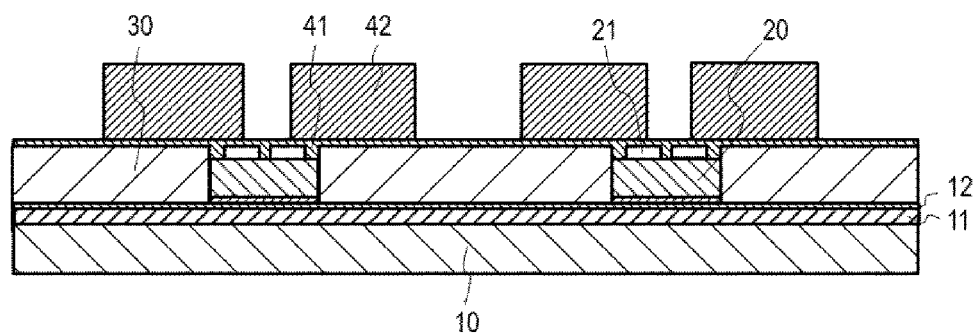
FIG. 9 is a schematic cross section diagram showing a manufacturing step of the light emitting module of an embodiment of the present invention.

Next, as shown in FIG. 9, when the resist is removed, the second metal layer appears as a portion of the wiring electrode.

Figure 10:
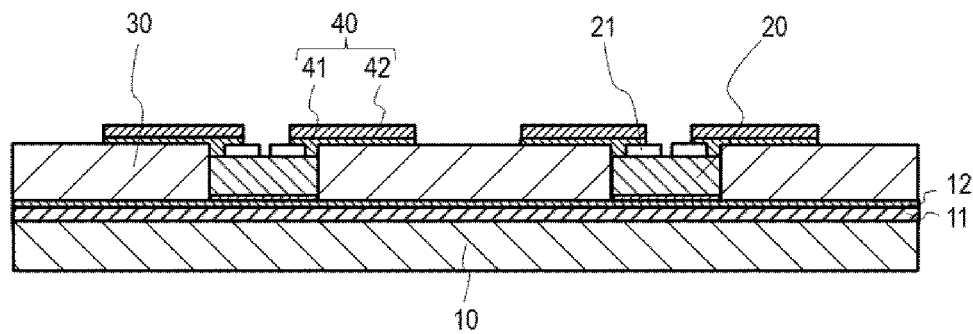
FIG. 10 is a schematic cross section diagram showing a manufacturing step of the light emitting module of an embodiment of the present invention.

Subsequently, as shown in FIG. 10, a portion of the second metal layer is removed by etching to make a thin film of the second metal layer, and also, the first metal layer of the region in which the second metal layer is not formed is removed. By doing this, the wiring electrode made by lamination of the first metal layer 41 and the second metal layer 42 is formed extending from the element electrode 21 of the light emitting element 20 over the coating layer 30.

In this way, with the wiring electrode, to form on the element electrode 21 of the light emitting element 20, even if position skew of the light emitting element 20 occurs in the step of placing the light emitting element 20, it is possible to adjust the position for providing the wiring electrode 40. By doing this, compared to when placing the light emitting element on the wiring electrode on the substrate, it is possible to suppress connection failure due to position skew of the element electrode 21 of the light emitting element 20 and the wiring electrode 40.

(Step for Forming Light Reflective Resin Layer 50)

Figure 11:
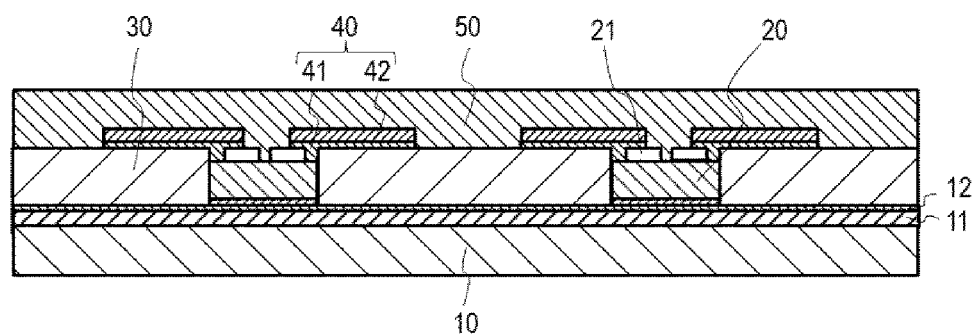
FIG. 11 is a schematic cross section diagram showing a manufacturing step of the light emitting module of an embodiment of the present invention.

Next, as shown in FIG. 11, the light reflective resin layer 50 is formed on the wiring electrode and the coating layer 30. As the light reflective resin layer 50, for example, it is possible to use an item for which titanium oxide and silicone resin are mixed. The light reflective resin layer 50 is formed using a method such as transfer molding, compressing molding, potting, printing, spraying, etc., for example. Also, the light reflective resin layer 50 may also be formed by sticking on the wiring electrode and the coating layer 30 a sheet comprising a material for which titanium oxide and silicone resin are mixed.

(Step for Joining Substrate 60)

Figure 12:
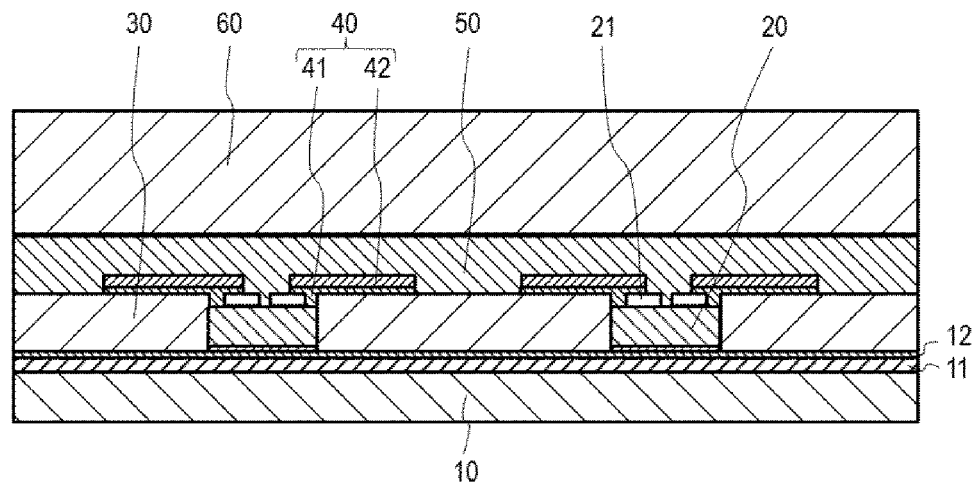
FIG. 12 is a schematic cross section diagram showing a manufacturing step of the light emitting module of an embodiment of the present invention.

Next, as shown in FIG. 12, the separately prepared substrate 60 is joined on top of the light reflective resin layer 50. It is possible to use glass, ceramic, etc., for the substrate 60.

(Step for Removing Support Member 10)

Figure 13:
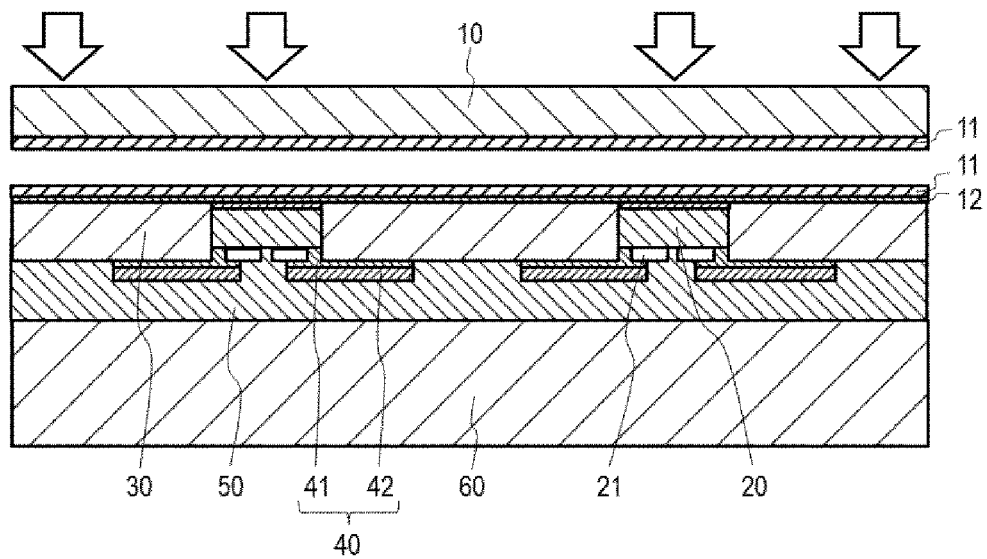
FIG. 13 is a schematic cross section diagram showing a manufacturing step of the light emitting module of an embodiment of the present invention.

Next, as shown in FIG. 13, the support member is removed using a laser lift-off method. In specific terms, by irradiating laser of a wavelength that is transmitted through the support member on the peeling layer 11 from the support member side, the light emitting element 20 and the support member 10 are separated.

(Step for Removing Coating Layer 30)

Next, as shown in FIG. 1, the coating layer 30 is removed. Removal of the coating layer 30 can be done using dry etching, etc. By removing the coating layer 30 together with the peeling layer 11, the protective layer 12, and the adhesive layer 13, the wiring electrode 40 and the light reflective resin layer are exposed surrounding the light emitting element 20.

Working in this way, it is possible to obtain a light emitting module 100. With the light emitting module 100, the top surface of the wiring electrode 40, and the top surface of the light reflective resin layer 50 provided surrounding the wiring electrode 40 are formed on the same plane.

Following, each constituent element of the light emitting module is explained.

(Substrate 60)

As long as the substrate 60 is an item for which the light reflective resin layer 50 can be formed on the top surface, the shape is not particularly limited, but it is preferable that the top surface be flat. It is possible to use an item with insulating properties for the substrate 60, and it is preferable to use glass, ceramic, etc., for example.

(Light Reflective Resin Layer 50)

The light reflective resin layer 50 is placed on the top surface of the substrate 60. By providing the light reflective resin layer 50 between the light emitting element 20 and the substrate, it is possible to reflect the light facing from the light emitting element 20 to the substrate 60 side to the light guide plate side.

The light reflective resin layer 50 has a reflection rate of 60% or greater with respect to the light emitted from the light emitting element 20, and preferably has a reflection rate of 90% or greater. The light reflective resin layer is preferably a resin that contains a white pigment, etc. Silicone resin that contains titanium oxide is particularly preferable. By doing this, it is possible to make the light emitting module inexpensive by using a large amount of a raw material that is inexpensive such as titanium oxide as the material used in relatively large amounts to cover one surface of the substrate 60.

(Wiring Electrode 40)

The wiring electrode 40 is electrically connected to the element electrode 21 of the light emitting element 20. By providing the wiring electrode 40, it is possible to electrically connect a plurality of the light emitting elements 20 to each other, for example, and possible to easily form the necessary circuits for local dimming, etc.

As the material of the wiring electrode 40, a material with low electrical resistance is preferable, with examples including items that contain at least one item selected from the group comprising Cu, Au, and Al. Among these, it is preferable to use Cu. Also, for the wiring electrode 40, it is preferable to be configured using a material for which the surface of the substrate side has a high light reflection rate with respect to the light from the light emitting element 20, and examples include items that contain at least one item selected from the group comprising Al, Ag, Pt, and Rh. Among these, it is preferable to use Al, Ag, or an alloy containing these metals with a high light reflection rate with respect to the light from the light emitting element 20. In particular, Al is preferable because it is reflective with respect to light from the light emitting element 20, and also has excellent electrical conductivity which is necessary as a wiring circuit. The thickness of the wiring electrode 40 is not particularly limited, but for example is 0.1 µm to 5 µm.

(Light Emitting Element 20)

The light emitting element 20 has the pair of electrodes provided on the same surface side. For the light emitting element 20, it is possible to use an already known semiconductor light emitting element configured from a nitride semiconductor, etc. Also, for the light emitting element 20, it is possible to select an item with any wavelength to obtain a desired light emission color.

As the light emitting element 20, it is possible to use light emitting diodes of various light emission wavelengths. Also, to obtain the desired light emission color, it is also possible to combine with a phosphor described later. In particular, to obtain white emitted light, it is preferable to combine a nitride semiconductor light emitting element that emits blue light with a phosphor that absorbs blue light and emits yellow light, green light, or red light.

(Light Reflective Member 70)

Figure 14:
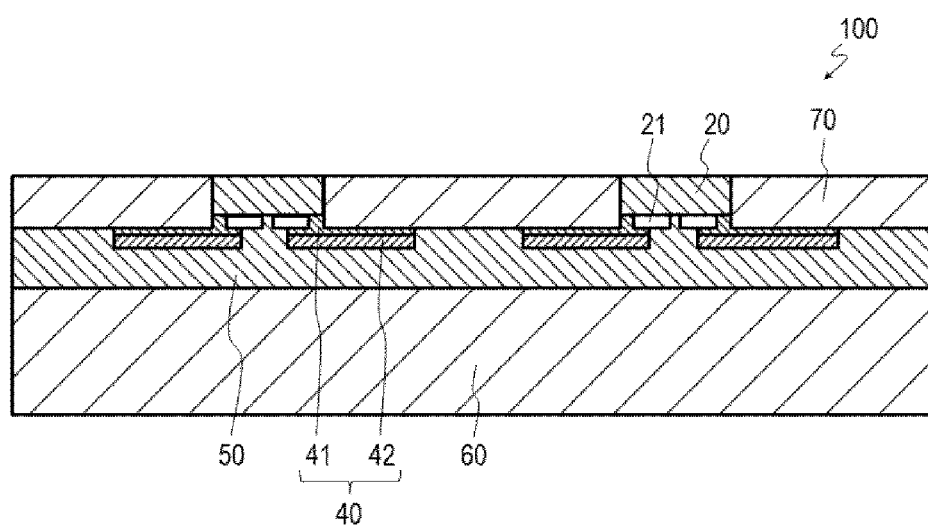
FIG. 14 is a schematic cross section diagram of the light emitting module of an embodiment of the present invention.

As shown in FIG. 14, the light emitting module 100 may have the light reflective member 70 be provided on the light reflective resin layer and the wiring electrode 40, and surrounding the light emitting element 20. By covering the electrode formation surface 20a of the light emitting element 20 and the side surface using the light reflective member 70, the light utilization efficiency is improved. Also, since it is possible to place the light reflective member 70 between mutually adjacent light emitting elements 20, when light is emitted selectively for a portion of the light emitting elements among the plurality of light emitting elements, it is possible to suppress leakage of light from the light emitting region to the non-light emitting region.

Figure 15:
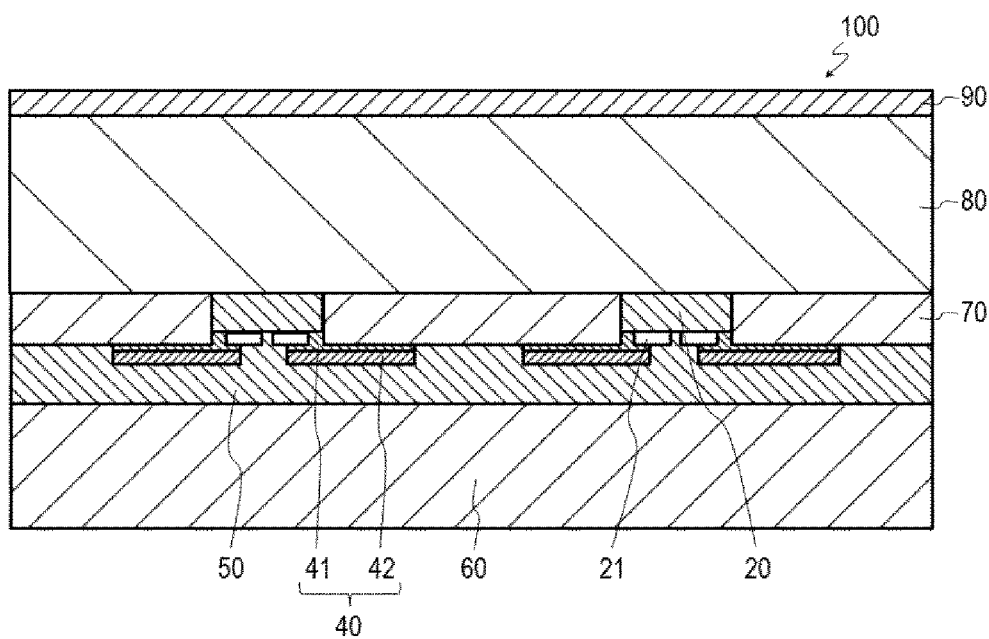
FIG. 15 is a schematic cross section diagram of the light emitting module of an embodiment of the present invention.

As shown in FIG. 15, it is also possible to further provide a light transmissive member 80 and a wavelength conversion member 90 above the light emitting element 20.

(Light Transmissive Member 80)

The light transmissive member 80 is preferably provided between the light emitting element 20 and the wavelength conversion member 90 described later. By doing this, it is possible to make the light emitted from the light emitting element 20 incident on the wavelength conversion member 90 with good efficiency. As the light transmissive member 80, it is possible to use transparent resin, glass, etc. As the transparent resin, it is preferable to use silicone resin, etc., from the perspective of durability, ease of molding, etc.

(Wavelength Conversion Member 90)

The wavelength conversion member 90 is placed on the top surface of the light transmissive member 80. The wavelength conversion member 90 contains phosphor that is able to absorb light from the light emitting element 20 and to emit light of other wavelengths. By doing this, the light emitting module 100 can emit to outside a mixed light of the light from the light emitting element 20 and the light that underwent wavelength conversion by the wavelength conversion member 90, such as white light, for example. By selecting the type of the light emitting element 20 and the type of the phosphor, it is possible to suitably adjust the color of the emitted light.

As shown in FIG. 15, in the light emitting module 100, one light transmissive member 80 and wavelength conversion member 90 are provided with respect to a plurality of the light emitting elements 20. By doing this, it is possible to configure the light emitting module 100 that is capable of large area planar light emission. The light transmissive member 80 and the wavelength conversion member 90 may also be provided for each light emitting element 20.

What is claimed is:

1. A light emitting module comprising:
   a substrate;
   a light reflective resin layer arranged on the substrate;
   wiring electrodes arranged over the light reflective resin layer so that the light reflective resin layer is arranged between the substrate and the wiring electrodes, the light reflective resin layer overlapping the wiring electrodes in a plan view; and
   a light emitting element having an electrode formation surface including a positive and negative pair of element electrodes, and a light emitting surface on a side opposite to the electrode formation surface, the light emitting element being arranged on top surfaces of the wiring electrodes with the element electrodes facing the top surfaces of the wiring electrodes, wherein
   the light reflective resin layer and the wiring electrodes are arranged between the light emitting element and the substrate.

2. The light emitting module of claim 1, further comprising
   a light reflective member arranged on the light reflective resin layer and the wiring electrodes, and surrounding the light emitting element.

3. The light emitting module of claim 2, wherein
   the light reflective member covers the electrode formation surface and a side surface of the light emitting element.

4. The light emitting module of claim 1, wherein
   the light reflective resin layer covers side surfaces of the wiring electrodes.

5. The light emitting module of claim 1, wherein
   the top surfaces of the wiring electrodes and a top surface of the light reflective resin layer surrounding the wiring electrodes are formed on the same plane.

6. The light emitting module of claim 4, wherein
   the top surfaces of the wiring electrodes and a top surface of the light reflective resin layer surrounding the wiring electrodes are formed on the same plane.

7. The light emitting module of claim 1, wherein
   the wiring electrodes are made of a material containing at least one item selected from the group consisting of Cu, Au and Al.

8. The light emitting module of claim 1, wherein
   surfaces of the wiring electrodes on a substrate side are configured by a material containing at least one item selected from the group consisting of Al, Ag, Pt, and Rh.

9. The light emitting module of claim 1, further comprising
   a light transmissive member arranged above the light emitting element.

10. The light emitting module of claim 9, further comprising
    a wavelength conversion member arranged on a top surface of the light transmissive member.

11. The light emitting module of claim 1, further comprising
    a plurality of light emitting elements spaced apart from each other, and
    the wiring electrodes electrically connect the element electrodes of the plurality of light emitting elements.

12. The light emitting module of claim 10, further comprising
    a plurality of light emitting elements placed with a designated interval open, and
    the wiring electrodes electrically connect the element electrodes of the plurality of light emitting elements.

13. The light emitting module of claim 12, wherein
    the plurality of light emitting elements are covered by the wavelength conversion member and the light transmissive member.

* * * * *